US010886178B2

(12) United States Patent
Lee et al.

(10) Patent No.: US 10,886,178 B2
(45) Date of Patent: Jan. 5, 2021

(54) DEVICE WITH HIGHLY ACTIVE ACCEPTOR DOPING AND METHOD OF PRODUCTION THEREOF

(71) Applicant: GLOBALFOUNDRIES Inc., Grand Cayman (KY)

(72) Inventors: Tek Po Rinus Lee, Malta, NY (US); Annie Levesque, Saratoga Springs, NY (US); Qun Gao, Clifton Park, NY (US); Hui Zang, Guilderland, NY (US); Rishikesh Krishnan, Cohoes, NY (US); Bharat Krishnan, Mechanicville, NY (US); Curtis Durfee, Guilderland, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 46 days.

(21) Appl. No.: 16/109,258

(22) Filed: Aug. 22, 2018

(65) Prior Publication Data
US 2020/0066593 A1    Feb. 27, 2020

(51) Int. Cl.
| H01L 29/167 | (2006.01) |
| H01L 21/8234 | (2006.01) |
| H01L 27/088 | (2006.01) |
| H01L 29/78 | (2006.01) |
| H01L 23/532 | (2006.01) |
| H01L 21/02 | (2006.01) |
| H01L 29/40 | (2006.01) |
| H01L 23/535 | (2006.01) |

(52) U.S. Cl.
CPC ........... *H01L 21/823418* (2013.01); *H01L 21/02532* (2013.01); *H01L 21/02573* (2013.01); *H01L 21/823475* (2013.01); *H01L 21/823481* (2013.01); *H01L 23/535* (2013.01); *H01L 23/53257* (2013.01); *H01L 23/53295* (2013.01); *H01L 27/0886* (2013.01); *H01L 29/401* (2013.01); *H01L 29/7848* (2013.01)

(58) Field of Classification Search
CPC ................. H01L 21/823418; H01L 27/0886
See application file for complete search history.

(56) References Cited

U.S. PATENT DOCUMENTS

| 6,013,546 A | 1/2000 | Gardner et al. |
| 8,975,708 B2 | 3/2015 | Toh et al. |
| 9,059,024 B2 | 6/2015 | Glass et al. |

(Continued)

OTHER PUBLICATIONS

Everaert et al., "Sub-10-9 Ω.cm2 Contact Resistivity on p-SiGe Achieved by Ga Doping and Nanosecond Laser Activation", published in 2017 Symposium on VLSI Technology Papers, Jun. 5-8, 2017, Kyoto, Japan, 2 pages.

*Primary Examiner* — Moazzam Hossain
*Assistant Examiner* — Hajar Kolahdouzan
(74) *Attorney, Agent, or Firm* — Ditthavong & Steiner P.C.

(57) ABSTRACT

A device including a triple-layer EPI stack including SiGe, Ge, and Si, respectively, with Ga confined therein, and method of production thereof. Embodiments include an EPI stack including a SiGe layer, a Ge layer, and a Si layer over a plurality of fins, the EPI stack positioned between and over a portion of sidewall spacers, wherein the Si layer is a top layer capping the Ge layer, and wherein the Ge layer is a middle layer capping the SiGe layer underneath; and a Ga layer in a portion of the Ge layer between the SiGe layer and the Si layer.

20 Claims, 8 Drawing Sheets

(56) References Cited

U.S. PATENT DOCUMENTS

| | | |
|---|---|---|
| 9,799,736 B1 | 10/2017 | Ebrish et al. |
| 2018/0315608 A1* | 11/2018 | Tang ................... H01L 21/022 |
| 2018/0331214 A1* | 11/2018 | Cheng ............... H01L 29/66545 |

* cited by examiner

DEVICE WITH HIGHLY ACTIVE ACCEPTOR DOPING AND METHOD OF PRODUCTION THEREOF

TECHNICAL FIELD

The present disclosure relates to semiconductor devices, including integrated circuits (ICs). The present disclosure is particularly applicable to fin field-effect transistor (FinFET) with reduced contact resistance and methods of fabrication.

BACKGROUND

As technology nodes continue to advance and decrease in size, and more and more transistors are provided on smaller surfaces, the resistance increases. In current semiconductor processing, FinFET devices in the 7 nanometer (nm) technology node and beyond are limited by high contact resistance. Dopant implantation, e.g., boron (B) which is a common dopant for p-type transistors, may be implemented to reduce contact resistance. However, B has a low solubility in materials with high germanium (Ge) content, resulting in a higher contact resistance.

A lower contact resistance may be achieved by replacing B with gallium (Ga) in a high Ge concentration silicon germanium (SiGe) epitaxial (EPI), because Ga has a superior solid solubility in Ge. However, Ga requires Ge concentration to be more than 60%, and the integration of high Ge concentration in the source/drain (S/D) EPI is challenging because of incompatibility with conventional annealing techniques, and gouging into SiGe EPI with Ge concentration more than 50%.

A need, therefore, exists for devices with highly active acceptor doping and reduced contact resistance.

SUMMARY

An aspect of the present disclosure is a device including a triple-layer EPI stack including SiGe, Ge, and silicon (Si), respectively, with Ga confined therein.

Another aspect of the present disclosure is a method of forming a triple-layer EPI stack including SiGe, Ge and Si, respectively, for confining Ga.

According to the present disclosure, some technical effects may be achieved in part by a device including: an EPI stack including a SiGe layer, a Ge layer, and a Si layer over a plurality of fins, the EPI stack positioned between and over a portion of sidewall spacers, wherein the Si layer is a top layer capping the Ge layer, and wherein the Ge layer is a middle layer capping the SiGe layer underneath; and a Ga layer in a portion of the Ge layer between the SiGe layer and the Si layer.

Another aspect of the present disclosure is a method of forming a doped metal-SiGe interface, the method including: forming an EPI stack including a SiGe layer, a Ge layer, and a Si layer over a plurality of fins, the EPI stack positioned between and over portions of sidewall spacers, wherein the Si layer is a top layer capping the Ge layer, and wherein the Ge layer is a middle layer capping the SiGe layer underneath; and forming a Ga layer in a portion of the Ge layer, wherein the Ga layer is between the SiGe layer and the Si layer.

A further aspect of the present disclosure is a device including: a triple-layer EPI stack including a SiGe layer which includes about 55% to 85% of Ge, a Ge layer including an in-situ doped B and a Si layer including an undoped Si or a B doped Si over a plurality of fins and in-between and over a portion of sidewall spacers, wherein the Si layer is a top layer capping the Ge layer, and wherein the Ge layer is a middle layer capping the SiGe layer underneath; and a Ga layer in a portion of the Ge layer between the SiGe layer and the Si layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of increased contact resistance and gouging attendant upon FinFET devices doped with B. The problem is solved, inter alia, by forming a multi-layer, e.g., a triple-layer, EPI stack for confining Ga.

Methodology in accordance with embodiments of the present disclosure includes forming an EPI stack including a SiGe layer, a Ge layer, and a Si layer over a plurality of fins, the EPI stack positioned between and over a portion of sidewall spacers, wherein the Si layer is a top layer capping the Ge layer, and wherein the Ge layer is a middle layer capping the SiGe layer underneath; and a Ga layer in a portion of the Ge layer between the SiGe layer and the Si layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
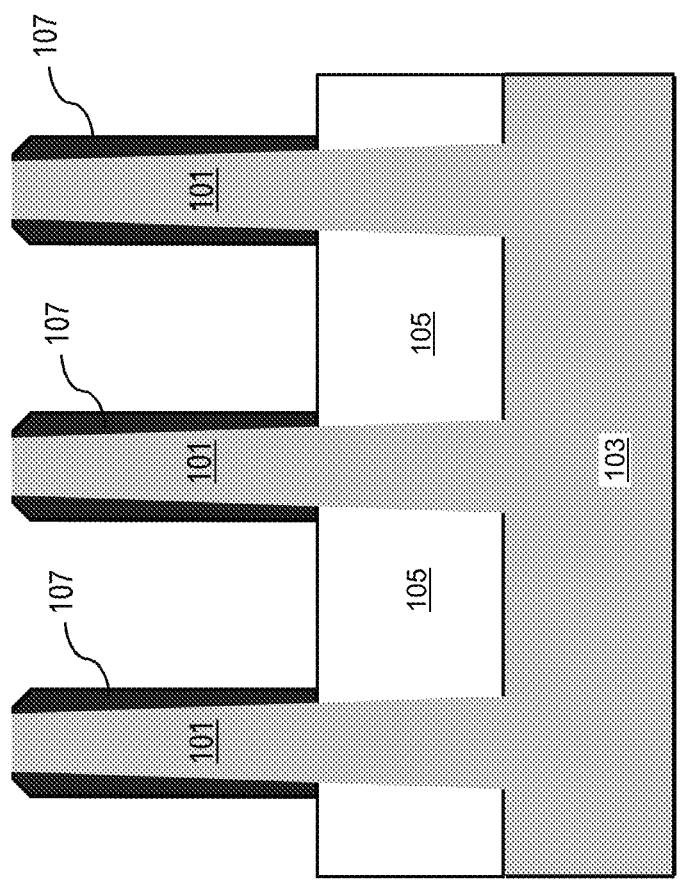
FIGS. 1 through 8 schematically illustrate cross-sectional views of a process flow for forming a triple-layer EPI stack including SiGe, Ge, and Si, respectively, for confining Ga, in accordance with an exemplary embodiment.
Figure 2:
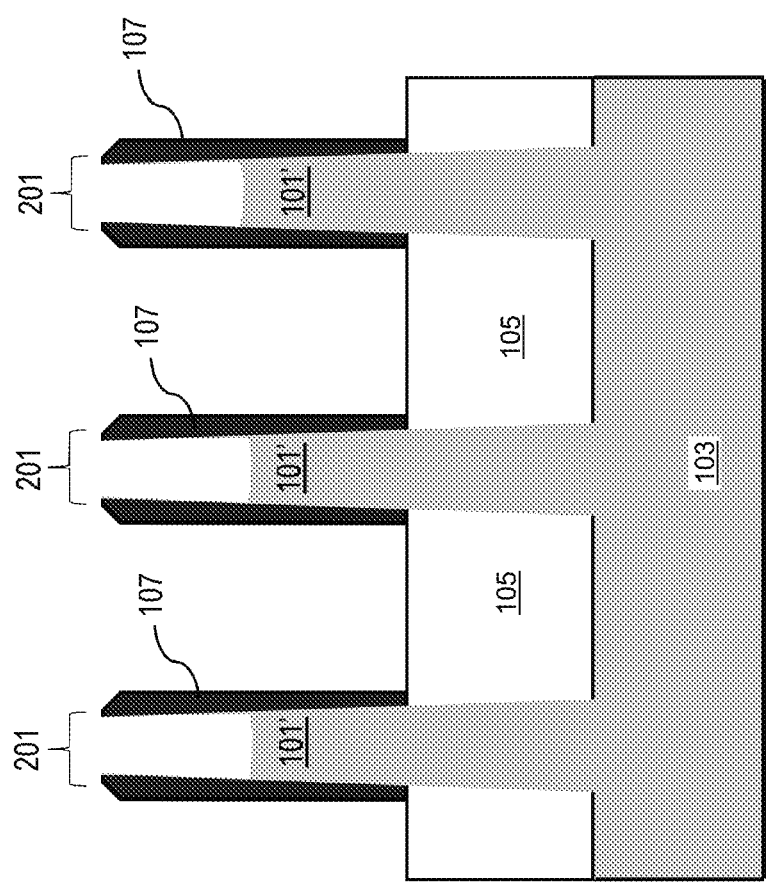

FIGS. 1 through 8 schematically illustrate cross-sectional views of a process flow for forming a triple-layer EPI stack including SiGe, Ge, and Si, respectively, for confining Ga, in accordance with an exemplary embodiment. Referring to FIG. 1, a plurality of fins 101 are formed, e.g., to a thickness of about 3 nm to about 15 nm, over a Si substrate 103. Next, an inter-layer dielectric (ILD) 105 is formed over the Si substrate 103 and on sidewalls of the bottom portion of the plurality of fins 101. In this instance, the upper surface of the ILD 105 is substantially coplanar to the upper surface of the bottom portion of the plurality of fins 101. Thereafter, sidewall spacers 107 are formed, e.g., of silicon oxide (SiOx), silicon nitride (SiNx), silicon-oxy-carbide (SixOxC), or silicon-oxy-carbide-nitride (SixOxCxNx), to a width, e.g., of about 2 nm to about 10 nm, on the sidewalls of an upper portion of the plurality of fins 101 and over a portion of the ILD 105. As illustrated in FIG. 2, a portion of the upper portion of the plurality of fins 101 is removed, e.g., by reactive-ion etching (ME), cluster ion beam etching or neutral beam etching, thereby forming the plurality of fins 101' and cavities 201 having a depth, e.g., of about 30 nm to about 60 nm.

Figure 3:
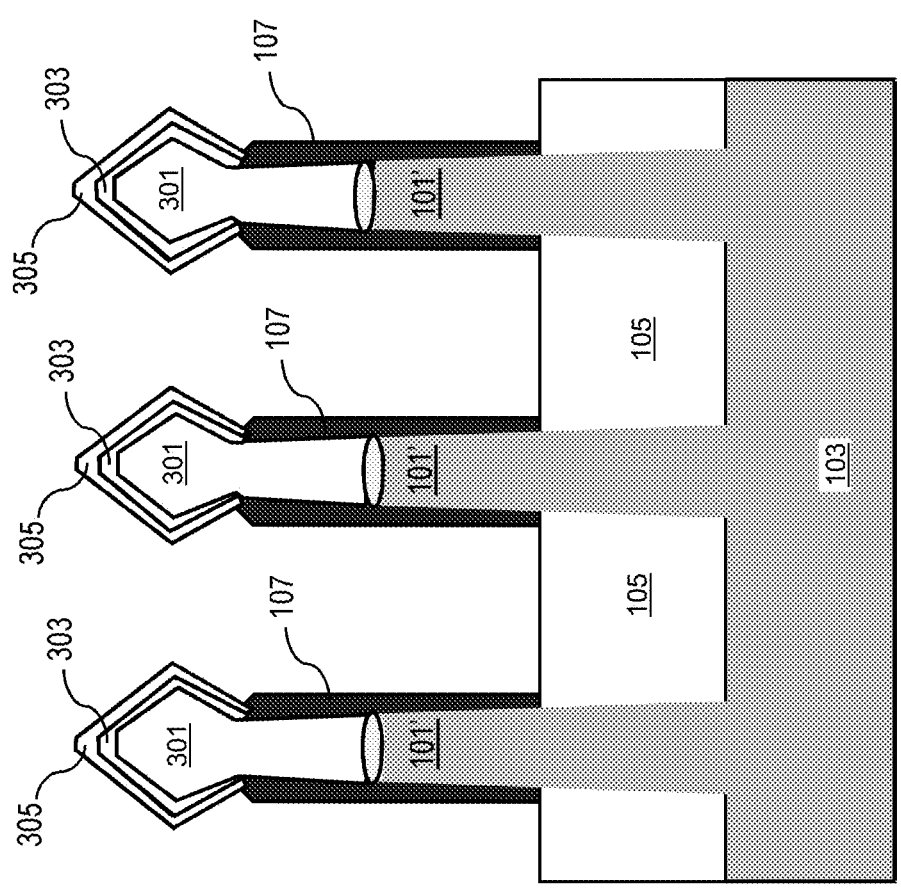
Figure 4:
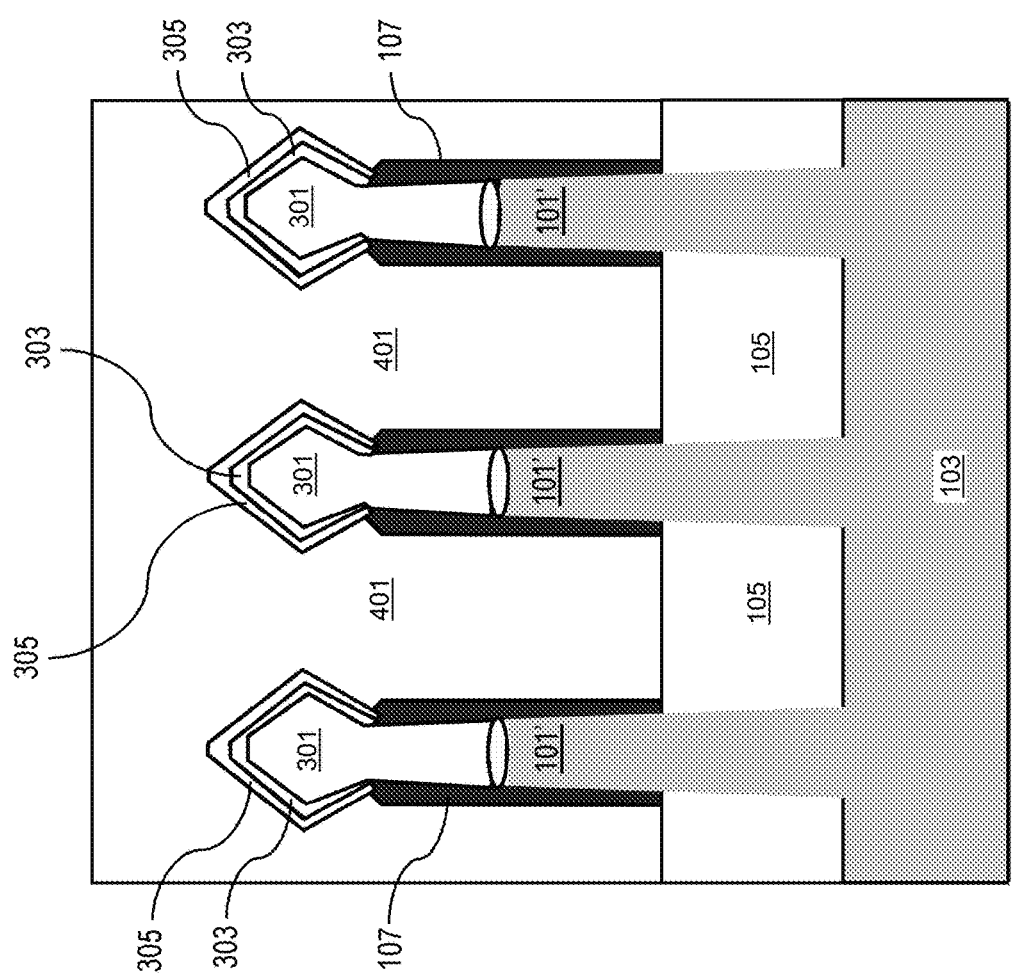

In FIG. 3, a triple-layer EPI stack is formed, e.g., grown epitaxially, over the plurality of fins 101' and is positioned between the sidewall spacers 107. Firstly, a SiGe layer 301 including about 55% to 85% of Ge is formed, e.g., to a thickness of about 30 nm to about 40 nm, over the plurality of fins 101' and between the sidewall spacers 107. Then, a Ge layer 303 including an in-situ doped B is formed, e.g., to a thickness of about 2 nm to about 4 nm, over the SiGe layer 301. Subsequently, a Si layer 305 including an undoped Si or a B doped Si is formed, e.g., to a thickness of about 1 nm to about 2 nm, over the Ge layer 303. In this instance, the Si layer 305 is the top layer capping the Ge layer 303, and the Ge layer 303 is the middle layer capping the SiGe layer 301. In one instance, the Si layer 305 works as a stopping layer, and significantly reduces gouging into SiGe EPI with Ge. In another instance, the epitaxially grown SiGe layer 301 over the plurality of fins is a raised S/D region. Thereafter, an ILD layer 401 is conformally formed, e.g., by a combination of chemical vapor deposition (CVD) and high density plasma deposition (HDPD), over the ILD 105, sidewall spacers 107 and the Si layer 305.

Figure 5:
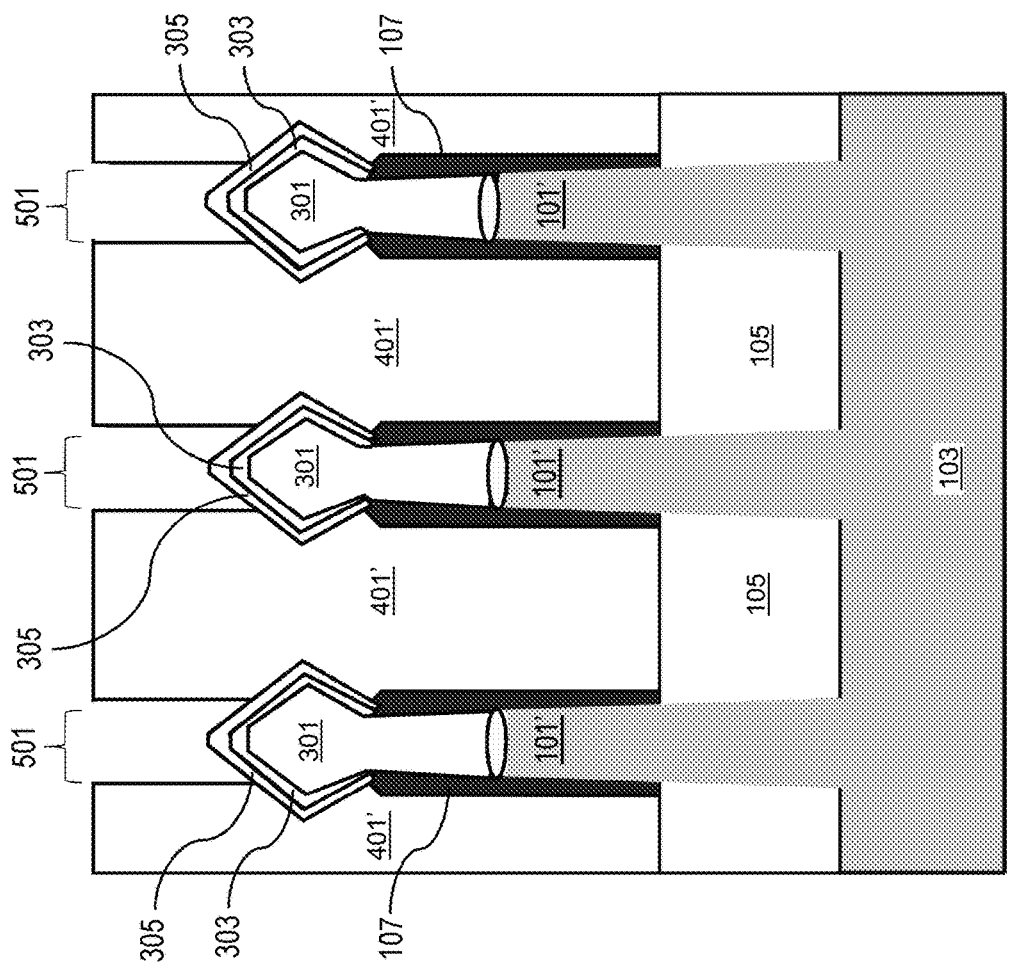
Figure 6:
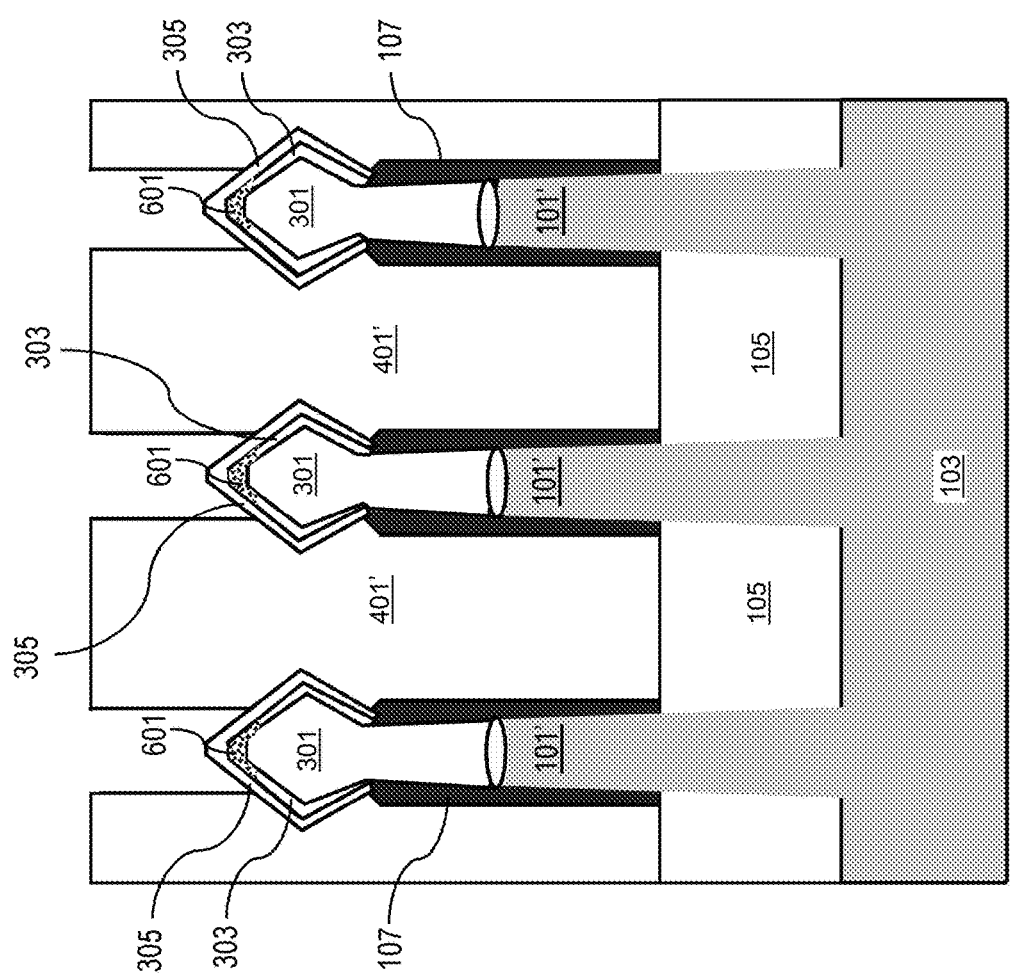

Referring to FIG. 5, a portion of the ILD layer 401 is removed, e.g., by ME or any other similar etching processes, exposing a portion of the Si layer 305, and forming ILD layer 401' and contact cavity 501 having a width, e.g., of about 5 nm to about 25 nm. Then, a Ga layer 601 is formed, e.g., by doping or implanting about 2 nm to about 4 nm of Ga with a target depth, in a portion of the Ge layer 303, as illustrated in FIG. 6. In one instance, due to the solubility differences between the triple-layer EPI stack, i.e., SiGe/Ge/Si, Ga diffuses into Si and SiGe but is confined in Ge because it has the highest solid solubility in that specific layer, resulting in a highly doped Ge surface for low contact resistance. In one instance, the confinement of Ga in the triple-layer EPI stack results in the Ga concentration of about 2E20 cm$^{-3}$. Thereafter, the Ga layer 601 is activated by annealing performed at a temperature, e.g., of about 400° C. to about 1350° C., for a time period, e.g., of about 100 nanosecond to about 3 seconds. In one instance, the Ga layer 601 is confined between the SiGe layer 301 and the Si layer 305, and the solubility of Ga is the highest in Ge followed by SiGe and Si. As a result, the triple-layer EPI stack of SiGe/Ge/Si may have the highest amount of Ga layer 601 being confined in the Ge layer 303 after processing.

Figure 7:
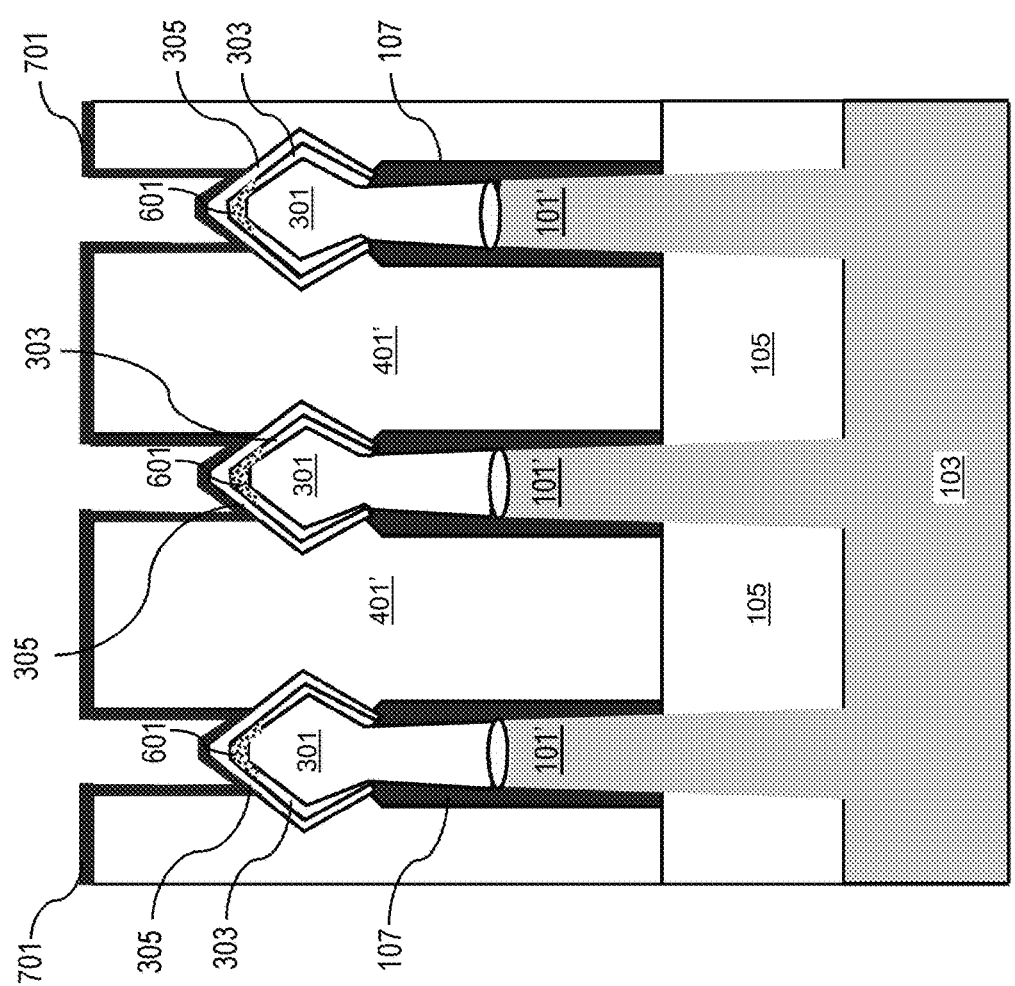
Figure 8:
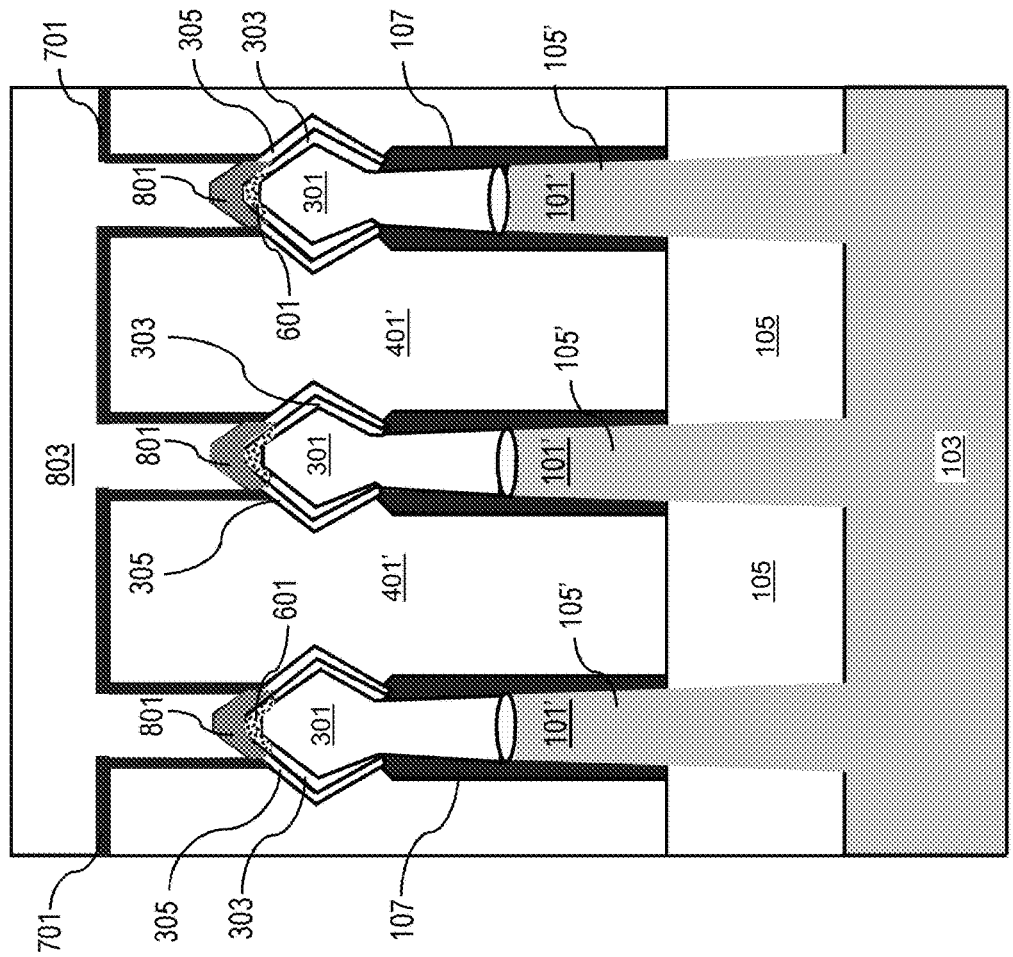

In FIG. 7, a metal liner 701 is formed, e.g., of Ti, nickel (Ni), platinum (Pt), nickel-platinum (NiPt), nickel-platinum-titanium (NiPtTi), terbium (Tb), erbium (Er), ytterbium (Yb), titanium nitride (TiN), SiNx and combinations, to a thickness, e.g., of about 2 nm to about 8 nm, over the ILD layer 401' and exposed portion of the Si layer 305. Then in FIG. 8, as a result of an interaction between the metal liner 701 and the underlying EPI material, e.g., Si or SiGe, a metal silicide contact 801 is formed. In one instance, the metal silicide contact 801 is formed, e.g., of titanium silicide (TiSi), in a portion of the metal liner 701 and the Si layer 305, providing a silicide-EPI interface. In another instance, the interaction is activated with an annealing process, wherein the metal silicide contact 801 fully consumes the Si layer 305 to provide a silicide-EPI interface, and wherein the EPI is Ga doped Ge. Thereafter, a metal layer 803 is formed, e.g., of tungsten (W) or cobalt (Co), over the metal liner 701 and the metal silicide contact 801 by a deposition process, e.g., a CVD or a combination of physical vapor deposition with CVD or electro-chemical-plating, providing a highly doped metal-SiGe interface.

The embodiments of the present disclosure can achieve several technical effects, such as an ultra-low contact resistance by implementing a highly active Ga doping in a Ge or SiGe layer, and reduced gouging. In addition, the EPI stack for Ga dopant confinement reduces integration complexity and cost. Further, the embodiments result in a highly doped and a precise metal-semiconductor interface as Ga is confined within the Ge layer and TiSi formation can be accurately tuned to consume the Si layer. Furthermore, the EPI stack to prevent out-diffusion does not require additional SiN cap which is challenging to remove. Devices formed in accordance with embodiments of the present disclosure enjoy utility in various industrial applications, e.g., microprocessors, smartphones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated FinFET semiconductor devices, particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
    an epitaxial (EPI) stack comprising a silicon germanium (SiGe) layer, a germanium (Ge) layer, and a silicon (Si) layer over a plurality of fins, the EPI stack positioned between and over a portion of sidewall spacers, wherein the Si layer is a top layer capping the Ge layer, and wherein the Ge layer is a middle layer capping the SiGe layer underneath; and
    a gallium (Ga) layer in a portion of the Ge layer confined between the SiGe layer and the Si layer.

2. The device according to claim 1, wherein the plurality of fins is over a Si substrate, the device further comprising:
    an ILD layer over the Si substrate and on sidewall portions of the plurality of fins, wherein an upper surface of the ILD layer is substantially coplanar with an upper surface of a bottom portion of the plurality of fins; and
    the sidewall spacers are on sidewalls of an upper portion of the plurality of fins and over a portion of the ILD layer, the sidewall spacer extending beyond the plurality of fins forming a cavity over the plurality of fins.

3. The device according to claim 2, further comprising:
a second ILD layer over the ILD layer and a portion of the Si layer of the EPI stack; and
a metal liner over the second ILD layer and a portion of the Si layer.

4. The device according to claim 3, further comprising:
a metal silicide contact in a portion of the metal liner and the Si layer; and
a metal layer over the metal liner and the metal silicide contact.

5. The device according to claim 3, wherein the metal liner comprises titanium (Ti) or titanium nitride (TiN).

6. The device according to claim 4, wherein the metal silicide contact comprises titanium silicide (TiSi), and wherein the metal layer comprises tungsten (W) or cobalt (Co).

7. The device according to claim 1, wherein the SiGe layer over the plurality of fins is a raised source/drain (S/D) region.

8. The device according to claim 1, wherein the SiGe layer has a thickness of 30 nanometer (nm) to 40 nm.

9. The device according to claim 1, wherein the Ge layer has a thickness of 2 nm to 4 nm.

10. The device according to claim 1, wherein the Si layer has a thickness of 1 nm to 2 nm.

11. A method of forming a doped metal-silicon germanium (SiGe) interface, the method comprising:
forming an epitaxial (EPI) stack comprising a SiGe layer, a germanium (Ge) layer, and a silicon (Si) layer over a plurality of fins, the EPI stack positioned between and over portions of sidewall spacers, wherein the Si layer is a top layer capping the Ge layer, and wherein the Ge layer is a middle layer capping the SiGe layer underneath; and
forming a gallium (Ga) layer in a portion of the Ge layer, wherein the Ga layer is between the SiGe layer and the Si layer.

12. The method according to claim 11, comprising forming the plurality of fins and the sidewall spacers for the EPI stack by:
forming the plurality of fins over a Si substrate;
forming an ILD layer over the Si substrate and on sidewall portions of the plurality of fins, wherein an upper surface of the ILD layer is substantially coplanar with an upper surface of a bottom portion of the plurality of fins;
forming the sidewall spacers on sidewalls of an upper portion of the plurality of fins and over a portion of the ILD layer; and
removing a portion of the upper portion of the plurality of fins, forming a cavity.

13. The method according to claim 12, further comprising:
forming a second ILD layer over the ILD layer and the Si layer of the EPI stack;
removing a portion of the second ILD layer, exposing a portion of the Si layer; and
forming the Ga layer in a portion of the Ge layer of the EPI stack by doping.

14. The method according to claim 13, further comprising:
forming a metal liner over the second ILD layer and a portion of the Si layer;
forming a metal silicide contact in a portion of the metal liner and the Si layer, providing a silicide-EPI interface; and
forming a metal layer over the metal liner and the metal silicide contact.

15. The method according to claim 11, wherein the confinement of the Ga in the EPI stack results in the Ga concentration of about 2E20 cm$^{-3}$.

16. The method according to claim 11, wherein the SiGe layer comprises about 55% to 85% of Ge, wherein the Ge layer comprises an in-situ doped boron (B), and wherein the Si layer comprises an undoped Si or a B doped Si.

17. The method according to claim 11, wherein the SiGe layer over the plurality of fins is a raised source/drain (S/D) region.

18. A device comprising:
a triple-layer epitaxial (EPI) stack comprising a silicon germanium (SiGe) layer comprising about 55% to 85% of Ge, a germanium (Ge) layer comprising an in-situ doped boron (B) and a silicon (Si) layer comprising an undoped Si or a B doped Si over a plurality of fins and in-between and over a portion of sidewall spacers, wherein the Si layer is a top layer capping the Ge layer, and wherein the Ge layer is a middle layer capping the SiGe layer underneath; and
a gallium (Ga) layer in a portion of the Ge layer between the SiGe layer and the Si layer.

19. The device according to claim 18, wherein the plurality of fins is over a Si substrate, the device further comprising:
an ILD layer over the Si substrate and on sidewall portions of the plurality of fins, upper surface of the ILD layer substantially coplanar to upper surface of a bottom portion of the plurality of fins; and
the sidewall spacers on sidewalls of an upper portion of the plurality of fins and over a portion of the ILD layer, the sidewall spacer extending beyond the plurality of fins forming a cavity over the plurality of fins.

20. The device according to claim 19, further comprising:
a second ILD layer over the ILD layer and a portion of the Si layer of the triple-layer EPI stack;
a titanium (Ti) or titanium nitride (TiN) layer over the second ILD layer and a portion of the Si layer;
a titanium silicide (TiSi) layer in a portion of the Ti or TiN layer and the Si layer; and
a tungsten (W) or cobalt (Co) layer over the Ti or TiN layer and the TiSi layer.

* * * * *